(12) United States Patent
Choi et al.

(10) Patent No.: US 10,432,185 B1
(45) Date of Patent: Oct. 1, 2019

(54) TURN-OFF OF POWER SWITCHING DEVICE

(71) Applicant: TEXAS INSTRUMENTS INCORPORATED, Dallas, TX (US)

(72) Inventors: Jae Won Choi, Dallas, TX (US); Richard Turkson, Princeton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/119,902

(22) Filed: Aug. 31, 2018

Related U.S. Application Data

(60) Provisional application No. 62/657,929, filed on Apr. 16, 2018.

(51) Int. Cl.
  *H03K 17/0812* (2006.01)
  *H01L 27/06* (2006.01)

(52) U.S. Cl.
  CPC .... *H03K 17/08122* (2013.01); *H01L 27/0629* (2013.01)

(58) Field of Classification Search
  None
  See application file for complete search history.

(56) References Cited

U.S. PATENT DOCUMENTS

| | | | |
|---|---|---|---|
| 4,492,883 A * | 1/1985 | Janutka | H03K 17/122 327/377 |
| 6,661,275 B2 * | 12/2003 | Logiudice | G11C 5/14 327/374 |
| 9,628,061 B2 * | 4/2017 | Lu | H03K 5/1534 |

\* cited by examiner

*Primary Examiner* — Jeffery S Zweizig
(74) *Attorney, Agent, or Firm* — Tuenlap Chan; Charles A. Brill; Frank D. Cimino

(57) ABSTRACT

A system includes a storage capacitor coupled between an input voltage source and a ground terminal, a voltage sensing circuit coupled to the input voltage source and to the storage capacitor, a first transistor coupled to the voltage sensing circuit, a current mirror circuit coupled to the first transistor, a diode coupled between the storage capacitor and the current mirror circuit, and a second transistor configured to couple between a gate of a power switching device and the ground terminal. A gate of the second transistor is coupled to the storage capacitor by way of the voltage sensing circuit.

22 Claims, 4 Drawing Sheets

US 10,432,185 B1

TURN-OFF OF POWER SWITCHING DEVICE

CROSS-REFERENCE TO RELATED APPLICATIONS

The present application claims priority to U.S. Provisional Patent Application No. 62/657,929, which was filed Apr. 16, 2018 and is titled "Transistor Switch Turn-Off After VIN Power Loss." The present application relates to U.S. Provisional Patent Application No. 62/485,892, which was filed Apr. 14, 2017 and is titled "Transistor Switch Turn-Off Based On Regenerative Feedback Of Gate Parasitic Charge." Both of these provisional applications are hereby incorporated herein by reference in their entirety.

SUMMARY

In accordance with at least one example of the disclosure, a system includes a storage capacitor coupled between an input voltage source and a ground terminal, a voltage sensing circuit coupled to the input voltage source and to the storage capacitor, a first transistor coupled to the voltage sensing circuit, a current mirror circuit coupled to the first transistor, a diode coupled between the storage capacitor and the current mirror circuit, and a second transistor configured to couple between a gate of a power switching device and the ground terminal. A gate of the second transistor is coupled to the storage capacitor by way of the voltage sensing circuit.

In accordance with another example of the disclosure, a system includes a storage capacitor coupled between an input voltage source and a ground terminal, a voltage sensing circuit coupled to the input voltage source and to the storage capacitor, a first transistor coupled to the voltage sensing circuit and to the storage capacitor, a current mirror circuit coupled to the first transistor, a diode coupled between the storage capacitor and the current mirror circuit, and a second transistor configured to couple between a gate of a power switching device and the input voltage source. A gate of the second transistor is coupled to the storage capacitor.

In accordance with an example of the disclosure, a system includes a regenerative current feedback loop, a voltage sensing circuit coupled to the regenerative current feedback loop and configured to activate the regenerative current feedback loop when an input voltage source drops below a threshold, and a storage capacitor coupled to the regenerative current feedback loop. In response to being activated, the regenerative current feedback loop is configured to charge the storage capacitor from a gate capacitance of a power switching device. The system also includes a gate pull-down device configured to couple a gate of the power switching device to a ground terminal in response to the storage capacitor becoming increasingly charged.

BRIEF DESCRIPTION OF THE DRAWINGS

For a detailed description of various examples, reference will now be made to the accompanying drawings in which.

DETAILED DESCRIPTION

A power switch for an electronic device couples an input voltage source to the electronic device. The power switch is, for example, an n-type or p-type metal-oxide-semiconductor field effect transistor (MOSFET), and may be referred to generally as a "power FET." During normal operation, a gate driver applies a gate voltage to the gate of the power FET to turn the power FET on/off. When turning the power FET on, the gate driver controls the increase in the output voltage supplied to the electronic device. By controlling the increase in voltage supplied to the electronic device, the high initial current required to charge electronic device capacitance, or inrush current, is also controlled.

In some cases, the input voltage source may drop to 0V, such as during an electrical outage or loss, although the power FET remains turned on. When the input voltage source is later restored, because the power FET is already fully on, the gate driver does not control the increase in voltage supplied to the electronic device. As a result, the output voltage supplied to the electronic device rises immediately along with the input voltage. This causes a large inrush current to the electronic device, which can damage components of the electronic device.

An example of the present disclosure that addresses the foregoing problems includes an integrated circuit (IC) that senses an input voltage source loss/outage and, in the case of an n-type power FET, pulls a gate of the power FET down to ground, turning the power FET off while the input voltage source is not available. Similarly, in the case of a p-type power FET that is turned on when a negative voltage is applied (e.g., using a negative charge pump), another example of the present disclosure includes an IC that senses an input voltage source loss/outage and pulls a gate of the power FET up to the input voltage, turning the power FET off while the input voltage source is not available. In either case, when the input voltage source is restored, the power FET is turned on with a slew rate control as if it had been switched on normally, avoiding the problems of a large inrush current noted above.

Figure 1:
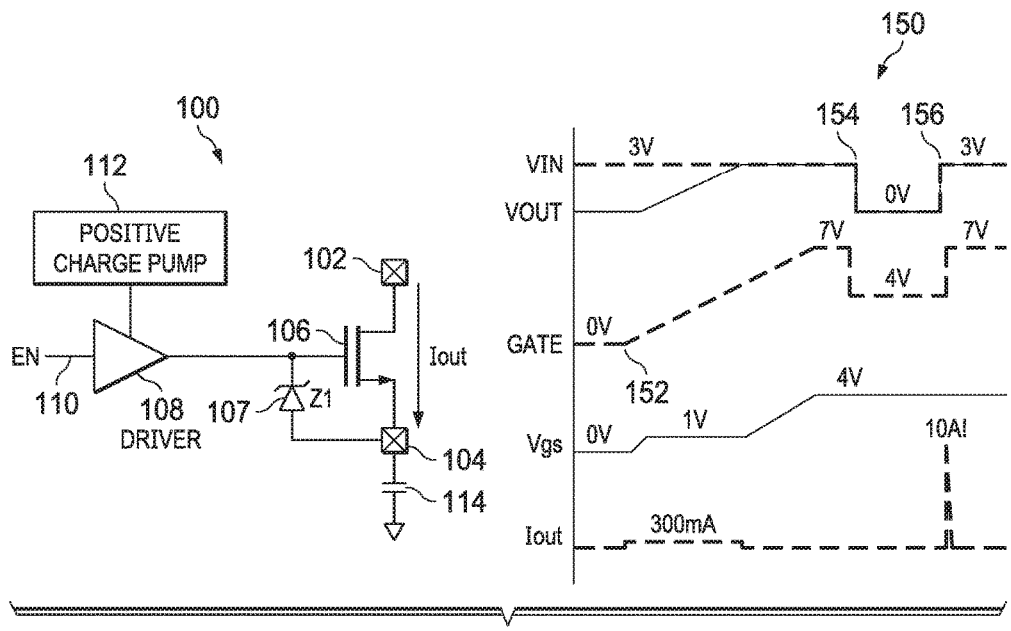
FIG. 1 shows a circuit schematic diagram and associated timing diagram in accordance with various examples.

FIG. 1 depicts a circuit schematic diagram 100 of a power switch for an electronic device. The circuit schematic diagram 100 includes an input voltage source 102 and the electronic device is represented by an output voltage load 104 and an output capacitor 114, which output capacitor 114 leads to the inrush current problem noted above when a rapid change in voltage occurs. An n-type power FET 106 couples and acts as a switch between the input voltage source 102 and the output voltage load 104. A gate driver 108 applies a high voltage to a gate of the n-type power FET 106 when enabled by an input 110 to the gate driver 108. The input 110 to the gate driver 108 is, for example, a button or toggle switch of the electronic device 104, 114. A positive charge pump 112 is coupled to the gate driver 108 so that when enabled, the voltage applied by the gate driver 108 to the gate of the n-type power FET 106 is greater than the input voltage 102. Thus, when enabled, the gate driver 108 causes the n-type power FET 106 to turn on, applying the input voltage from the input voltage source 102 to the electronic device 104, 114. Similarly, when disabled, the gate driver 108 causes the n-type power FET 106 to turn off, removing the supply of the input voltage source 102 to the electronic device 104, 114.

FIG. 1 also includes a timing diagram 150 that demonstrates the functionality of the circuit schematic diagram 100. In the timing diagram 150, "VIN" corresponds to the voltage of the input voltage source 102, "VOUT" corresponds to the voltage of the output voltage load 104, "GATE" corresponds to the voltage supplied to the gate of the n-type power FET 106, "Vgs" corresponds to the gate-to-source voltage of the n-type power FET 106, and "Iout" corresponds to the current flowing through the drain-source channel of the n-type power FET 106. Initially when the electronic device 104, 114 is turned off, VIN is at 3V, GATE is at 0V, the n-type power FET 106 is turned off, and VOUT—and, by extension, Vgs—are also at 0V. The x-axis of timing diagram 150 corresponds to time, and the y-axis of timing diagram 150 corresponds to amplitude of voltage (or current, in the case of Iout).

At the time indicated by 152, VIN is at 3V for example, and the gate driver 108 is enabled, for example in response to a power button of the electronic device 104, 114 being pressed or a switch toggled. As a result, the gate driver 108 applies a high voltage to the gate of the n-type power FET 106; however, the gate driver 108 is configured to provide a constant current, and thus GATE increases linearly due to the gate capacitance of the n-type power FET 106. VOUT remains at 0V until Vgs (the difference between GATE and VOUT) is greater than a threshold voltage of the n-type power FET 106, in this example 1V. At this point, the n-type power FET 106 is turned on, and VOUT rises linearly with GATE until VOUT is equal to VIN. While VOUT rises linearly or has a constant derivative, Iout is also a constant value due to the output capacitor 114. However, the gate driver 108 is designed such that the rate of change of GATE, and thus VOUT, is limited so that the magnitude of Iout does not exceed what is tolerable by the electronic device 104, 114. In the example of FIG. 1, Iout is approximately 300 mA during normal powering on of the electronic device 104, 114. GATE continues to rise linearly until it is equal to VIN (3V) plus the additional voltage supplied by the positive charge pump 112. GATE may be clamped for example by a Zener diode 107 to limit Vgs of the n-type power FET 106 to avoid breakdown of the gate oxide, which in this example is a Vgs of 4V at which point GATE is 7V.

At the time indicated by 154, a loss or outage occurs to input voltage source 102, and thus VIN and VOUT both drop to 0V. However, the gate driver 108 is not able to pull-down the gate of the n-type power FET 106 because of the lack of a power supply caused when VIN drops to 0V, which results in an inability to turn on a pull-down transistor, for example. As a result, GATE only drops from 7V to 4V due to a coupling of parasitic gate-to-drain capacitance (Cgd) and gate-to-source capacitance (Cgs) of the n-type power FET 106. Thus, the n-type power FET 106 remains turned on. Subsequently at the time indicated by 156, the input voltage source 102 is restored, and thus VIN and VOUT both rise to 3V. Unlike previously, when VOUT rose linearly with GATE, now GATE is already at 4V before VIN is restored and 7V after VIN is restored due to coupling of the gate capacitance Cgd and Cgs of the n-type power FET 106, and the n-type power FET 106 remains turned on in both cases. As a result of the n-type power FET 106 remaining turned on, VOUT rises immediately with VIN. This immediate increase in VOUT results in a large spike in Iout, which is the inrush current described above, to 10A in the example of FIG. 1, although the current spike could be even greater (depending on the value of the output capacitor 114 and the on-resistance of the n-type power FET 106). This potentially damages the electronic device 104, 114, the n-type power FET 106, and any interconnects therebetween.

Figure 2:
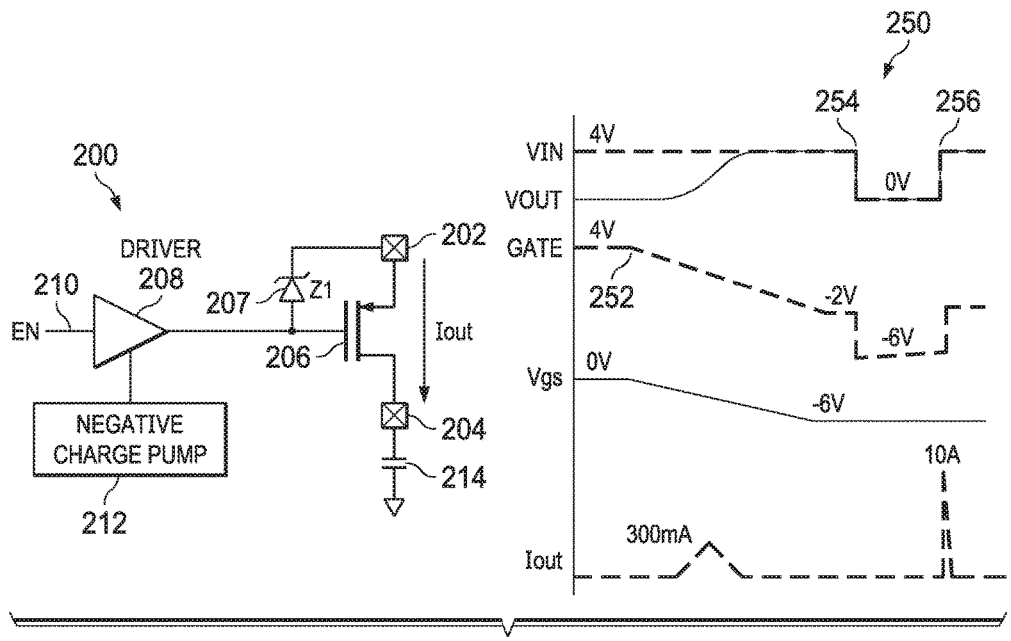
FIG. 2 shows a circuit schematic diagram and associated timing diagram in accordance with various examples.

FIG. 2 depicts a circuit schematic diagram 200 of a power switch for an electronic device. The circuit schematic diagram 200 is similar to the schematic 100 described above, in that it includes an input voltage source 202 and the electronic device is represented by an output voltage load 204 and an output capacitor 214. Unlike the schematic 100, the schematic 200 includes a p-type power FET 206 that couples and acts as a switch between the input voltage source 202 and the output voltage load 204. A gate driver 208 applies a low voltage to a gate of the p-type power FET 206 when enabled by an input 210 to the gate driver 208. The input 210 to the gate driver 208 is, for example, a button or toggle switch of the electronic device 204, 214. A negative charge pump 212 is coupled to the gate driver 208 so that when enabled, the voltage applied by the gate driver 208 to the gate of the p-type power FET 206 is negative. Thus, when enabled, the gate driver 208 causes the p-type power FET 206 to turn on, applying the input voltage 202 to the electronic device 204, 214. Similarly, when disabled, the gate driver 208 applies a high voltage (e.g., pulls the gate of the p-type power FET 206 to the voltage of the input voltage source 202) and causes the p-type power FET 206 to turn off, removing the supply of the input voltage source 202 to the electronic device 204, 214.

FIG. 2 also includes a timing diagram 250 that demonstrates the functionality of the circuit schematic diagram 200. In the timing diagram 250, "VIN" corresponds to the voltage of the input voltage source 202, "VOUT" corresponds to the voltage of the output voltage load 204, "GATE" corresponds to the voltage supplied to the gate of the p-type power FET 206, "Vgs" corresponds to the gate-to-source voltage of the p-type power FET 206, and "Iout" corresponds to the current to the electronic device 204, 214. Initially when the electronic device 204, 214 is turned off, VIN and GATE are at 0V, and thus Vgs is at 0V and the p-type power FET 206 is turned off, so VOUT is also at 0V.

At the time indicated by 252, VIN is at 4V, for example, and the gate driver 208 is enabled, for example in response to a power button of the electronic device 204, 214 being pressed, or a switch toggled. As a result, the gate driver 208 applies a negative voltage (owing to the negative charge pump 212) to the gate of the p-type power FET 206; however, the gate driver 208 is configured to provide a constant current, and thus GATE decreases linearly due to the gate capacitance of the p-type power FET 206. VOUT remains at 0V until Vgs (the difference between GATE and VIN) is less than a threshold voltage of the p-type power FET 206, in this example approximately −1V, at which point VOUT begins to rise exponentially to VIN as the p-type power FET 206 fully turns on. While VOUT rises exponentially, Iout increases to a peak at the highest VOUT slew rate, and then decreases as VOUT approaches VIN and tapers to VIN, due to the output capacitor 214. However, the gate driver 208 is designed such that the rate of change of GATE is gradual, which reduces the VOUT slew rate, and thus the magnitude of Iout does not exceed what is tolerable by the electronic device 204, 214. GATE continues to decrease linearly until it is equal to VIN (4V) minus the voltage of the negative charge pump 212. GATE may be clamped for example by a Zener diode 207 to limit Vgs of the p-type power FET 206 to avoid breakdown of the gate oxide, which in this example is a Vgs of −6V at which point GATE is −2V.

At the time indicated by 254, a loss or outage occurs to the input voltage source 202, and thus VIN and VOUT both drop to 0V. However, the gate driver 208 is not able to pull-up the gate of the p-type power FET 206 because of the lack of a power supply caused when VIN drops to 0V. As a result, GATE drops to −6V due to a coupling of parasitic gate capacitance Cgd and Cgs of the p-type power FET 206, and thus the p-type power FET 206 remains turned on. Subsequently at the time indicated by 256, the input voltage source 202 is restored, and thus VIN and VOUT both rise to 4V. Unlike previously, when VOUT rose exponentially but gradually as the p-type power FET 206 turned on, now GATE is already at −6V before VIN is restored and −2V after VIN is restored due to coupling of the gate capacitance Cgd and Cgs of the p-type power FET 206. The p-type power FET 206 thus remains turned on in both cases. As a result of the p-type power FET 206 remaining turned on, VOUT rises immediately with VIN. This immediate increase in VOUT results in a large spike in Iout, which is the inrush current described above, to 10A in the example of FIG. 2, although the current spike could be even greater (depending on the value of the output capacitor 214 and the on-resistance of the p-type power FET 206). This damages the electronic device 204, 214, the p-type power FET 206, and any interconnects therebetween.

Figure 3A:
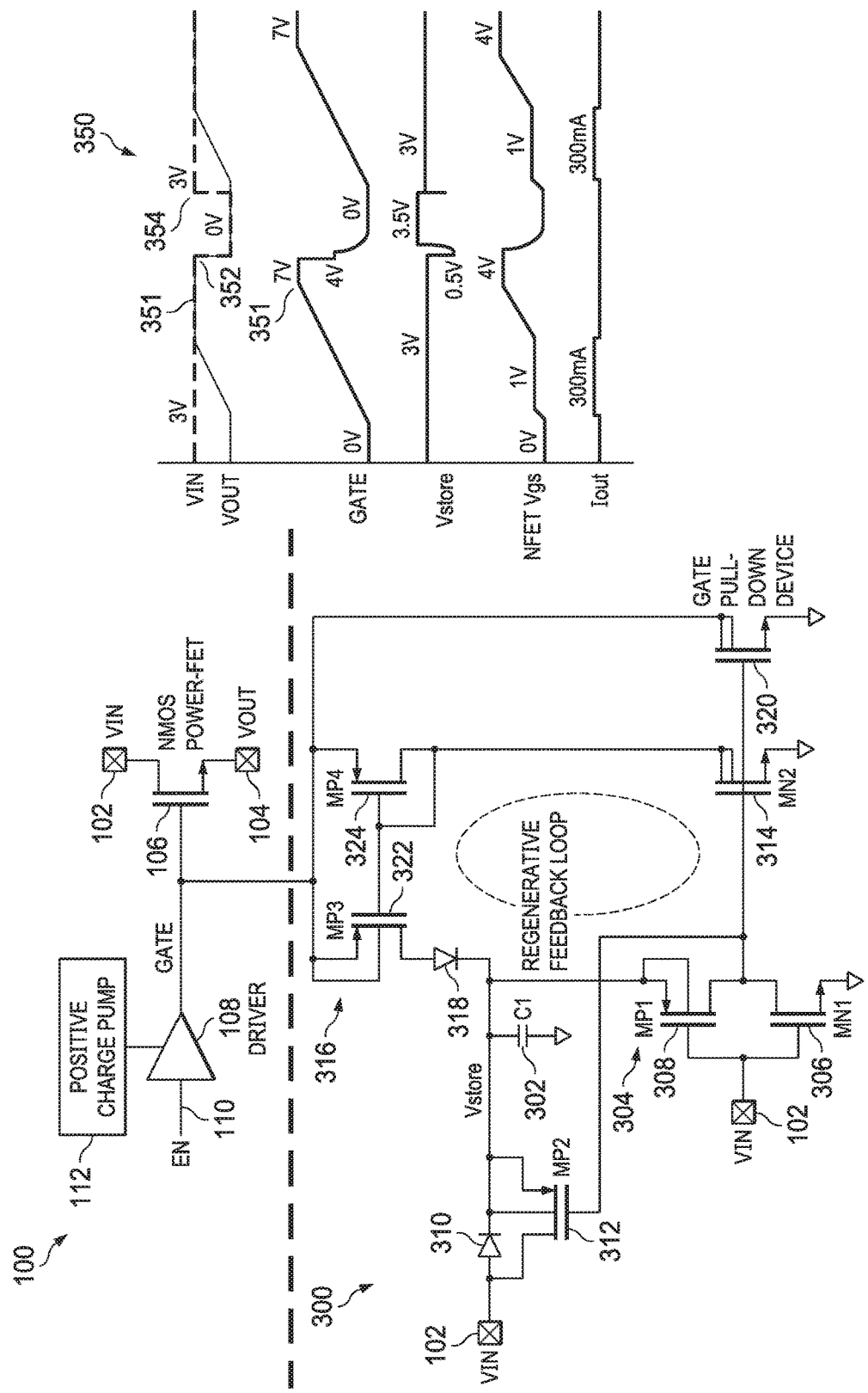
FIG. 3a shows a circuit schematic diagram and associated timing diagram for an n-type power switching device in accordance with various examples.

In an example, FIG. 3a depicts a circuit schematic diagram of a system 300 for turning off a power switching device without a power supply, for example in response to a loss or outage to an input voltage source. In the example of FIG. 3a, the power switching device is an n-type power FET 106 as described above with respect to FIG. 1. Additionally, an input voltage source 102, an output voltage load 104, a gate driver 108, a gate driver input 110, and a positive charge pump 112 all function as described above with respect to FIG. 1. These elements provide context for the example of FIG. 3a.

Figure 3B:
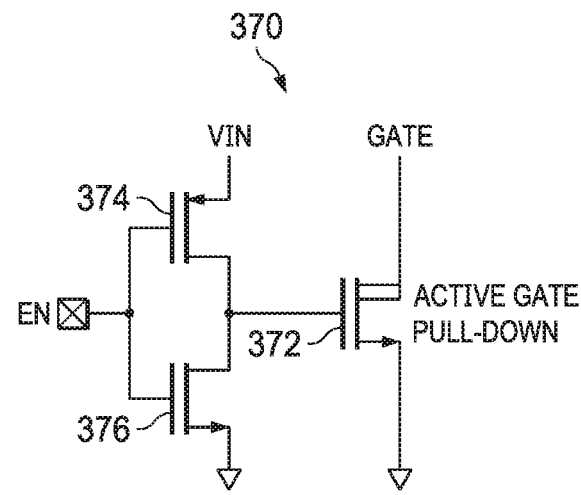
FIG. 3b shows a circuit schematic diagram for active gate pull-down of an n-type power switching device in accordance with various examples.

Referring briefly to FIG. 3b, an example circuit 370 for active pull-down of the gate of the n-type power FET 106 is shown. When VIN is present (power is available) and the electronic device is turned off (the input 110 to the gate driver 108 is disabled), VIN is used to turn on a pull-down transistor (or a circuit including such a pull-down transistor), for example, to discharge the gate of the n-type power FET 106. In the example of FIG. 3b, an n-type MOSFET 372 is the pull-down transistor, having its drain coupled to the gate of the n-type power FET 106 and its source coupled to ground. The input 110 signal, notated EN, is provided to an inverter including p-type MOSFET 374 and n-type MOSFET 376. An output of the inverter 374, 376 is coupled to the gate of the pull-down transistor 372, such that when EN goes low, the pull-down transistor 372 turns on and pulls the gate of the n-type power FET 106 to ground. However, as explained above, when VIN is not present, the pull-down transistor 372 cannot be turned on, and thus the gate of the n-type power FET 106 cannot be pulled to ground, which results in a large inrush current when VIN is subsequently restored.

To address these issues, the system 300 of FIG. 3a includes a storage capacitor 302 coupled between ground and the input voltage source 102. In this example, the storage capacitor 302 is coupled to the input voltage source 102 by way of a transistor 312, which is, for example, a p-type MOSFET 312 including a drain-to-body diode 310 as shown.

The system 300 also includes a voltage sensing circuit 304 that is coupled to the input voltage source 102 and to the storage capacitor 302. The voltage sensing circuit 304 includes two transistors, for example an n-type MOSFET 306 and a p-type MOSFET 308. The input voltage source 102 is coupled to a gate of each of the n-type MOSFET 306 and the p-type MOSFET 308. A drain of each of the n-type MOSFET 306 and the p-type MOSFET 308 are coupled together. A source of the p-type MOSFET 308 is coupled to the storage capacitor 302, and a source of the n-type MOSFET 306 is coupled to ground.

The system 300 also includes a transistor 314, which is, for example, an n-type MOSFET 314 coupled to the voltage sensing circuit 304. In particular, a gate of the n-type MOSFET 314 is coupled to a node between the n-type MOSFET 306 and the p-type MOSFET 308 of the voltage sensing circuit 304. A source of the n-type MOSFET 314 is coupled to ground and a drain of the n-type MOSFET 314 is coupled to a current mirror circuit 316. The current mirror circuit 316 is also coupled to the storage capacitor 302 by way of a diode 318. The current mirror circuit 316 includes two p-type MOSFETs 322, 324, where a gate of the first p-type MOSFET 322 is coupled to a gate of the second p-type MOSFET 324, which is in turn coupled to a drain of the second p-type MOSFET 324 and to the n-type MOSFET 314. Further, sources of both the first and second p-type MOSFETs 322, 324 are coupled to the gate of the n-type power FET 106. A drain of the first p-type MOSFET 322 couples to the diode 318.

The system 300 further includes a gate pull-down transistor 320 coupled between the gate of the n-type power FET 106 and ground. The gate pull-down transistor 320 is an n-type MOSFET in this example. A gate of the gate pull-down transistor 320 is coupled to the node between the n-type MOSFET 306 and the p-type MOSFET 308 of the voltage sensing circuit 304, and thus is also coupled to the storage capacitor 302 via the p-type MOSFET 308.

FIG. 3a also includes a timing diagram 350 that demonstrates the functionality of the system 300 as it relates to the n-type power FET 106 operation. In the timing diagram 350, "VIN" corresponds to the voltage of the input voltage source 102, "VOUT" corresponds to the voltage of the output voltage load 104, "GATE" corresponds to the voltage supplied to the gate of the n-type power FET 106, "Vstore" corresponds to the voltage across the storage capacitor 302, "Vgs" corresponds to the gate-to-source voltage of the n-type power FET 106, and "Iout" corresponds to the current to the electronic device 104, 114.

Initially at the time indicated by 351, during normal, powered on operation of the electronic device, VIN is at 3V and GATE is at 7V, as described above with respect to FIG. 1. As a result of VIN being at 3V, the n-type MOSFET 306 of the voltage sensing circuit 304 is on and the p-type MOSFET 308 of the voltage sensing circuit 304 is off, which pulls the gate of the p-type MOSFET 312 to ground, and thus the p-type MOSFET 312 is also on. As a result of the p-type MOSFET 312 being on, the storage capacitor 302 is charged, and Vstore is equal to VIN or 3V.

As a result of the n-type MOSFET 306 of the voltage sensing circuit 304 being on, the gate of the n-type MOSFET 314 is also tied to ground. Thus, the n-type MOSFET 314 is off, as are the p-type MOSFETs 322, 324 of the current mirror circuit 316. This occurs as a result of no current flowing through the p-type MOSFET 324, and the p-type MOSFET 322 mirroring the lack of current flow. Finally, as a result of the n-type MOSFET 306 of the voltage sensing circuit 304 being on, the gate of the gate pull-down transistor 320 is also tied to ground, and thus the gate pull-down transistor 320 is off and does not impact GATE.

At the time indicated by 352, similar to above at 154 in FIG. 1, the input voltage source 102 is interrupted, for example due to a power outage. In other words, VIN and VOUT drop to 0V and GATE drops to 4V due to the coupling of a gate capacitance Cgs and Cgd of the n-type power FET 106, and Vstore drops along with VIN since the p-type MOSFET 312 is on. Once VIN drops below a threshold voltage of the n-type MOSFET 306, or about 0.5V in this example, the n-type MOSFET 306 of the voltage sensing circuit 304 turns off and the p-type MOSFET 308 of the voltage sensing circuit 304 turns on, which pulls the gate of the p-type MOSFET 312 to Vstore. Thus, the p-type MOSFET 312 also turns off since its source-to-gate voltage is 0V. Consequently, Vstore only falls to the threshold voltage of approximately 0.5V before the p-type MOSFET 312 is turned off, putting the Vstore node into a high impedance state. In some examples, the width-to-length ratios of the n-type MOSFET 306 and the p-type MOSFET 308 of the voltage sensing circuit 304 are selected such that the n-type MOSFET 306 is weaker (e.g., a smaller width-to-length ratio) and the p-type MOSFET 308 is stronger, so that the p-type MOSFET 308 is on with a lower on-resistance than that of the n-type MOSFET 306 when VIN reaches 0V.

As explained above, since the storage capacitor 302 stops discharging at approximately the threshold voltage of the n-type MOSFET 306, Vstore only falls to approximately 0.5V in this example. As a result of the p-type MOSFET 308 being on, Vstore is applied to the gate of the n-type MOSFET 314. In some examples, the n-type MOSFET 314 is designed such that it at least operates in its sub-threshold region with a gate voltage that is approximately the threshold voltage of the n-type MOSFET 306. In other words, when Vstore of only 0.5V is applied to the gate of the n-type MOSFET 314, a current flows through the n-type MOSFET 314. The gate pull-down transistor 320 also turns on and begins to discharge the gate of the n-type power FET 106 to ground.

The current mirror circuit 316 mirrors the current flowing through the n-type MOSFET 314, and since the diode 318 is forward-biased, begins to charge the storage capacitor 302 (from the gate capacitance of the n-type power FET 106) and Vstore begins to increase. As Vstore increases, the n-type MOSFET 314 is more strongly turned on, increasing the current flowing through both itself and the current mirror circuit 316, which in turn charges the storage capacitor 302 even faster. This regenerative, positive feedback loop allows the storage capacitor 302 to charge, and Vstore to increase, very quickly even if the n-type MOSFET 314 is only weakly turned on initially. In some examples, the gate pull-down transistor 320 is designed to be weaker than the n-type MOSFET 314, such that the gate capacitance of the n-type power FET 106 is largely discharged to the storage capacitor 302 before the gate pull-down transistor 320 fully discharges the gate of the n-type power FET 106 to ground.

As shown, Vstore rises to approximately 3.5V, which is the initial GATE of 4V minus a diode 318 voltage drop of approximately 0.5V. When Vstore is charged, in this case to approximately 3.5V, the gate pull-down transistor 320 is on and thus fully discharges GATE to 0V. Further, as a result of the gate capacitance of the n-type power FET 106 typically being much larger than the capacitance of the storage capacitor 302, the charge loss to ground is assumed to be minimal in the foregoing example. Subsequently at the time indicated by 354, VIN is restored and Vstore temporarily dips as the n-type MOSFET 306 is turned on, and then rises back to VIN as the p-type MOSFET 312 is turned on and the p-type MOSFET 308 is turned off. Because GATE has been discharged, VOUT rises normally as described above with respect to FIG. 1, and a large inrush current is avoided.

The system 300 allows GATE to be quickly discharged to 0V despite the fact that the gate driver 108 cannot discharge GATE since there is no power (e.g., VIN=0V) to turn on a pull-down transistor, for example, which would be the case when the input voltage source 102 is unavailable, but the electronic device is not turned off. Subsequently, upon the restoration of the input voltage source 102, VIN is again at 3V and thus the system 300 is decoupled from the gate of the n-type power FET 106. That is, as a result of VIN being at 3V, the n-type MOSFET 306 of the voltage sensing circuit 304 again turns on and the p-type MOSFET 308 of the voltage sensing circuit 304 again turns off, which pulls the gate of the n-type MOSFET 314 to ground, which stops current flowing through both the n-type MOSFET 314 and the current mirror circuit 316. The gate of the gate pull-down transistor 320 is also pulled to ground, turning it off as well.

As a result, upon the restoration of the input voltage source 102, VOUT again rises linearly as under normal power on operation, and Iout is a constant value that is limited such that the magnitude of Iout does not exceed what is tolerable by the electronic device. In other words, even after an unexpected interruption to the input voltage source 102, the system 300 allows for a subsequent restoration to the input voltage source 102 to have the same impact on the electronic device as a normal power on action, reducing the likelihood of damage to the electronic device.

Figure 4B:
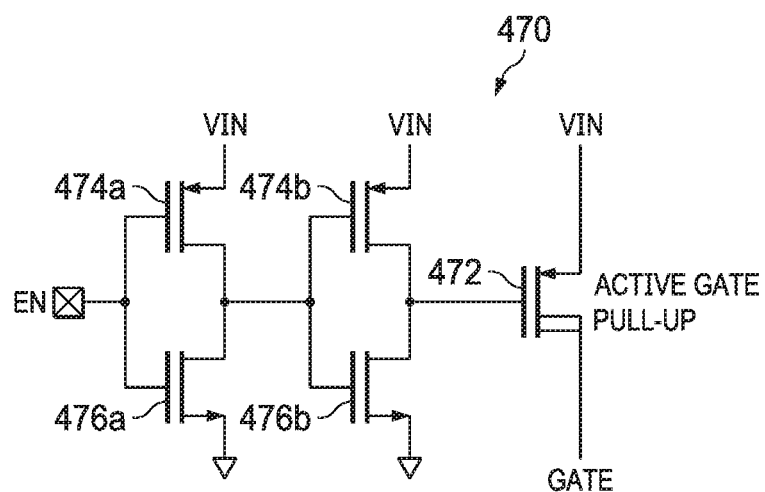
FIG. 4b shows a circuit schematic diagram for active gate pull-up of a p-type power switching device in accordance with various examples.
Figure 4A:
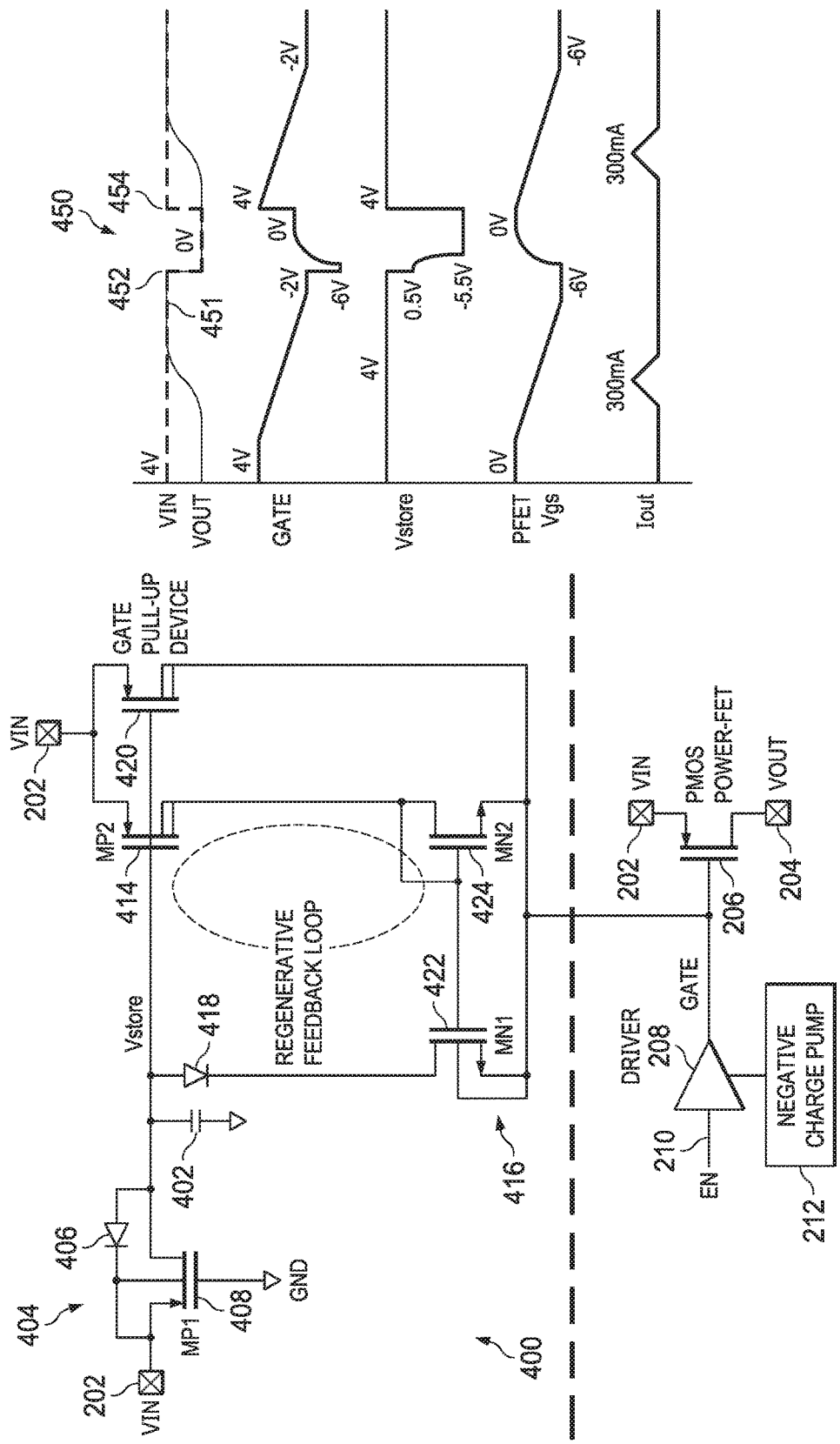
FIG. 4a shows a circuit schematic diagram and associated timing diagram for a p-type power switching device in accordance with various examples.

In another example, FIG. 4a depicts a circuit schematic diagram of a system 400 for turning off a power switching device without a power supply, for example in response to a loss or outage of an input voltage source. In the example of FIG. 4a, the power switching device is a p-type power FET 206 as described above with respect to FIG. 2. Additionally, an input voltage source 202, an output voltage load 204, a gate driver 208, a gate driver input 210, and a positive charge pump 212 all function as described above with respect to FIG. 2. These elements provide context for the example of FIG. 4a.

Referring briefly to FIG. 4b, an example circuit 470 for active pull-up of the gate of the p-type power FET 206 is shown. When VIN is present (power is available) and the electronic device is turned off (the input 210 to the gate driver 208 is disabled), VIN is used to turn on a pull-up transistor (or a circuit including such a pull-up transistor), for example, to charge the gate of the p-type power FET 206. In the example of FIG. 4b, a p-type MOSFET 472 is the pull-up transistor, having its drain coupled to the gate of the p-type power FET 206 and its source coupled to VIN. The input 210 signal, notated EN, is provided to first and second inverters including p-type MOSFETs 474a, 474b, respectively, and n-type MOSFETs 476a, 476b, respectively. An output of the inverters 474a, 476a/474b, 476b is coupled to the gate of the pull-up transistor 472, such that when EN goes low, the pull-up transistor 472 turns on and pulls the gate of the p-type power FET 306 to VIN. However, as explained above, when VIN is not present, the gate of the p-type power FET 206 cannot be pulled up, which results in a large inrush current when VIN is subsequently restored.

The system 400 includes a storage capacitor 402 coupled between ground and the input voltage source 202. In this example, the storage capacitor 402 is coupled to the input voltage source 202 by way of a transistor 408, which is, for example, a p-type MOSFET 408 including a drain-to-body diode 406 as shown. The combination of the diode 406 and the p-type MOSFET 408 may be referred to as a voltage sensing circuit 404, which will be explained in further detail below.

The system 400 also includes a transistor 414, which is, for example, a p-type MOSFET 414 coupled to the voltage sensing circuit 404. In particular, a gate of the p-type MOSFET 414 is coupled to the drain of the p-type MOSFET 408 of the voltage sensing circuit 404. A source of the p-type MOSFET 414 is coupled to the input voltage source 202 and a drain of the p-type MOSFET 414 is coupled to a current mirror circuit 416. The current mirror circuit 416 is also coupled to the storage capacitor 402 by way of a diode 418. The current mirror circuit 416 includes two n-type MOSFETs 422, 424, where a gate of the first n-type MOSFET 422 is coupled to a gate of the second n-type MOSFET 424, which is in turn coupled to a drain of the second n-type MOSFET 424 and to the p-type MOSFET 414. Further, sources of both the first and second n-type MOSFETs 422, 424 are coupled to the gate of the p-type power FET 206. A drain of the first n-type MOSFET 422 couples to the diode 418.

The system 400 further includes a gate pull-up transistor 420 coupled between the gate of the p-type power FET 206 and the input voltage source 202. The gate pull-up transistor 420 is a p-type MOSFET in this example. A gate of the gate pull-up transistor 420 is coupled to the drain of the p-type MOSFET 408 of the voltage sensing circuit 404, and is also coupled to the storage capacitor 402.

FIG. 4a also includes a timing diagram 450 that demonstrates the functionality of the system 400 as it relates to the p-type power FET 206 operation. In the timing diagram 450, "VIN" corresponds to the voltage of the input voltage source 202, "VOUT" corresponds to the voltage of the output voltage load 204, "GATE" corresponds to the voltage supplied to the gate of the p-type power FET 206, "Vstore" corresponds to the voltage across the storage capacitor 402, "Vgs" corresponds to the gate-to-source voltage of the p-type power FET 206, and "Iout" corresponds to the current to the electronic device 204, 214.

Initially at the time indicated by 451, during normal, powered on operation of the electronic device, VIN is at 4V and GATE is at −2V, as described above with respect to FIG. 2. Since the gate of the p-type MOSFET 408 of the voltage sensing circuit 404 is tied to ground, and as a result of VIN being at 4V, the p-type MOSFET 408 is on, the storage capacitor 402 is charged, and Vstore is equal to VIN or 4V.

As a result of the p-type MOSFET 408 of the voltage sensing circuit 404 being on, the gate of the p-type MOSFET 414 is also tied to VIN. Thus, the p-type MOSFET 414 is off, as are the n-type MOSFETs 422, 424 of the current mirror circuit 416, as a result of no current flowing through the n-type MOSFET 424 and the n-type MOSFET 422 mirroring the lack of current flow. Finally, as a result of the p-type MOSFET 408 of the voltage sensing circuit 404 being on, the gate of the gate pull-up transistor 420 is also tied to VIN, and thus the gate pull-up transistor 420 is off and does not impact GATE.

At the time indicated by 452, similar to above at 254 in FIG. 2, the input voltage source 202 is interrupted, for example due to a power outage. In other words, VIN and VOUT drop to 0V and GATE drops to −6V due to the coupling of a gate capacitance Cgs and Cgd of the p-type power FET 206, and Vstore drops along with VIN, since the p-type MOSFET 408 is on. Once VIN drops below a threshold voltage of the p-type MOSFET 408, or about 0.5V in this example, the p-type MOSFET 408 of the voltage sensing circuit 404 turns off. Thus, Vstore only falls to the threshold voltage of approximately 0.5V before the p-type MOSFET 408 is turned off, putting the Vstore node into a high impedance state.

As explained above, since the storage capacitor 402 stops discharging at approximately the threshold voltage of the p-type MOSFET 408, Vstore only falls to approximately 0.5V in this example. Although Vstore is applied to the gate of the p-type MOSFET 414, since the source of the p-type MOSFET 414 falls with VIN to 0V, the p-type MOSFET 414 does not initially turn on. However, the n-type MOSFET 422 is designed in some examples for a subthreshold leakage current to exist even when the p-type MOSFET 414 and the n-type MOSFET 424 are fully off. Thus, the storage capacitor 402 initially begins to discharge to the gate of the p-type power FET 206 as a result of the subthreshold leakage current through the n-type MOSFET 422. This is demonstrated in the timing diagram 450 by the initial slower rate of decrease of Vstore at 452. As Vstore falls below 0.5V, the p-type MOSFET 414 turns on and the current mirror circuit 416 mirrors the current flowing through the p-type MOSFET 414. The gate pull-up transistor 420 also turns on, although initially the current through the gate pull-up transistor 420 is relatively small.

As explained above, the current mirror circuit 416 mirrors the current flowing through the p-type MOSFET 414, and the storage capacitor 402 discharges through the diode 418 to the gate capacitance of the p-type power FET 206; Vstore decreases as a result. As Vstore decreases, the p-type MOSFET 414 is more strongly turned on, increasing the current flowing through both itself and the current mirror circuit 416. This, in turn, discharges the storage capacitor 402 to the gate of the p-type power FET 206 even faster. This regenerative, positive feedback loop allows the storage capacitor 402 to discharge, and Vstore to decrease, quickly even though initial discharging is by way of subthreshold leakage current through the n-type MOSFET 422. In some examples, the gate pull-up transistor 420 is designed to be weaker than the p-type MOSFET 414, such that the gate capacitance of the p-type power FET 206 is largely charged by the storage capacitor 402 before the gate pull-up transistor 420 fully charges the gate of the p-type power FET 206 to the input voltage source 202, which is at 0V.

As shown, Vstore drops to approximately −5.5V, which is the initial GATE of −6V plus a diode 418 voltage drop of approximately 0.5V. When Vstore is discharged, in this case to approximately −5.5V, the gate pull-up transistor 420 is on and thus fully pulls up GATE to VIN, or 0V. Further, as a result of the gate capacitance of the p-type power FET 206 typically being much larger than the capacitance of the storage capacitor 402, the charge gained from the input voltage source 202 is assumed to be minimal in the foregoing example. Subsequently at the time indicated by 454, VIN is restored and Vstore is charged to VIN by the p-type MOSFET 408 being turned on. Because GATE has been charged to 0V, VOUT rises normally as described above with respect to FIG. 2, and a large inrush current is avoided.

The system 400 allows GATE to be quickly charged to 0V without a power supply despite the fact that the gate driver 208 cannot pull-up GATE since there is no power (e.g., VIN=0V) to turn on a pull-up transistor. This would be the case, for instance, when the input voltage source 202 is unavailable but the electronic device is not turned off. Subsequently, upon the restoration of the input voltage source 202, VIN is again at 4V and thus the system 400 is decoupled from the gate of the p-type power FET 206. That is, as a result of VIN being at 4V, the p-type MOSFET 408 of the voltage sensing circuit 404 again turns on. When the p-type MOSFET 408 turns on, the gate of the p-type MOSFET 414 is pulled to VIN, which stops current flowing through both the p-type MOSFET 414 and the current mirror circuit 416. The gate of the gate pull-up transistor 420 is also pulled to VIN, turning it off as well.

As a result, upon the restoration of the input voltage source 202, VOUT again rises exponentially as under normal power on operation explained above with respect to FIG. 2, and Iout has a peak value that is limited such that the magnitude of Iout does not exceed what is tolerable by the electronic device. In other words, even after an unexpected interruption to the input voltage source 202, the system 400 allows for a subsequent restoration to the input voltage source 202 to have the same impact on the electronic device as a normal power on action, reducing the likelihood of damage to the electronic device.

In the foregoing discussion and in the claims, reference is made to a circuit for turning off a power switching device without a power supply. The various circuit elements correspond to hardware circuitry, for example implemented on an integrated circuit (IC). Indeed, in at least one example, the circuit for turning off a power switching device without a power supply is implemented on an IC.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
a storage capacitor coupled between an input voltage source and a ground terminal;
a voltage sensing circuit coupled to the input voltage source and to the storage capacitor;
a first transistor coupled to the voltage sensing circuit;
a current mirror circuit coupled to the first transistor;
a diode coupled between the storage capacitor and the current mirror circuit; and
a second transistor configured to couple between a gate of a power switching device and the ground terminal, wherein a gate of the second transistor is coupled to the storage capacitor by way of the voltage sensing circuit.

2. The system of claim 1 wherein the power switching device is an n-type metal-oxide-semiconductor field effect transistor.

3. The system of claim 1 further comprising a p-type metal-oxide-semiconductor field effect transistor coupled between the storage capacitor and the input voltage source.

4. The system of claim 1 wherein the voltage sensing circuit comprises an n-type metal-oxide-semiconductor field effect transistor (MOSFET) coupled to the ground terminal and a p-type MOSFET coupled to the n-type MOSFET and the storage capacitor, wherein the input voltage source is coupled to a gate of both the n-type and p-type MOSFETs.

5. The system of claim 4 wherein the first transistor comprises an n-type MOSFET, and wherein a gate of the first transistor is coupled to a node between the n-type and p-type MOSFETs of the voltage sensing circuit.

6. The system of claim 4 wherein the second transistor comprises an n-type MOSFET, and wherein the gate of the second transistor is coupled to a node between the n-type and p-type MOSFETs of the voltage sensing circuit.

7. The system of claim 6 wherein the gate of the second transistor is configured to couple to the storage capacitor in response to an input voltage source voltage being below a threshold.

8. The system of claim 1 wherein:
the current mirror circuit further comprises first and second p-type metal-oxide-semiconductor field effect transistors (MOSFETs);
a gate of the first p-type MOSFET is coupled to a gate of the second p-type MOSFET, which is in turn coupled to a drain of the second p-type MOSFET and to the first transistor;
sources of both the first and second p-type MOSFETs are coupled to the gate of the power switching device; and
a drain of the first p-type MOSFET is coupled to the diode.

9. The system of claim 1 further comprising an n-type metal-oxide-semiconductor field effect transistor (MOSFET) coupled between the gate of the power switching device and the ground terminal, wherein a gate of the n-type MOSFET is coupled to an inverted power enable input.

10. A system, comprising:
a storage capacitor coupled between an input voltage source and a ground terminal;
a voltage sensing circuit coupled to the input voltage source and to the storage capacitor;
a first transistor coupled to the voltage sensing circuit and to the storage capacitor;
a current mirror circuit coupled to the first transistor;
a diode coupled between the storage capacitor and the current mirror circuit; and
a second transistor configured to couple between a gate of a power switching device and the input voltage source, wherein a gate of the second transistor is coupled to the storage capacitor.

11. The system of claim 10 wherein the power switching device is a p-type metal-oxide-semiconductor field effect transistor.

12. The system of claim 10 wherein:
the voltage sensing circuit comprises a p-type metal-oxide-semiconductor field effect transistor (MOSFET);
the storage capacitor is coupled to the input voltage source by way of the voltage sensing circuit; and
a source of the p-type MOSFET is coupled to the input voltage source and a gate of the p-type MOSFET is coupled to the ground terminal.

13. The system of claim 10 wherein the first transistor comprises a p-type metal-oxide-semiconductor field effect transistor.

14. The system of claim 10 wherein the second transistor comprises a p-type metal-oxide-semiconductor field effect transistor.

15. The system of claim 10 wherein:
the current mirror circuit further comprises first and second n-type metal-oxide-semiconductor field effect transistors (MOSFETs);
a gate of the first n-type MOSFET is coupled to a gate of the second n-type MOSFET, which is in turn coupled to a drain of the second n-type MOSFET and to the first transistor;
sources of both the first and second p-type MOSFETs are coupled to the gate of the power switching device; and
a drain of the first p-type MOSFET is coupled to the diode.

16. The system of claim 10 further comprising a p-type metal-oxide-semiconductor field effect transistor (MOSFET) coupled between the gate of the power switching device and the input voltage source, wherein a gate of the p-type MOSFET is coupled to a power enable input.

17. A system, comprising:
a regenerative current feedback loop;
a voltage sensing circuit coupled to the regenerative current feedback loop and configured to activate the regenerative current feedback loop when an input voltage source drops below a threshold;
a storage capacitor coupled to the regenerative current feedback loop, wherein in response to being activated, the regenerative current feedback loop is configured to charge the storage capacitor from a gate capacitance of a power switching device; and
a gate pull-down device configured to couple a gate of the power switching device to a ground terminal in response to the storage capacitor becoming increasingly charged.

18. The system of claim 17 wherein the power switching device is an n-type metal-oxide-semiconductor field effect transistor.

19. The system of claim 17 further comprising a p-type metal-oxide-semiconductor field effect transistor coupled between the storage capacitor and the input voltage source.

20. The system of claim 17 wherein the voltage sensing circuit comprises an n-type metal-oxide-semiconductor field effect transistor (MOSFET) coupled to the ground terminal and a p-type MOSFET coupled to the n-type MOSFET and the storage capacitor, wherein the input voltage source is coupled to a gate of both the n-type and p-type MOSFETs.

21. The system of claim 20 wherein the gate pull-down device comprises an n-type MOSFET, and wherein the gate of the gate pull-down device is coupled to a node between the n-type and p-type MOSFETs of the voltage sensing circuit.

22. The system of claim 17 wherein:
the current mirror circuit further comprises first and second p-type metal-oxide-semiconductor field effect transistors (MOSFETs);
a gate of the first p-type MOSFET is coupled to a gate of the second p-type MOSFET, which is in turn coupled to a drain of the second p-type MOSFET and to the first transistor;
sources of both the first and second p-type MOSFETs are coupled to the gate of the power switching device; and
a drain of the first p-type MOSFET is coupled to the storage capacitor.

* * * * *